(12) United States Patent
Ohkido

(10) Patent No.: US 6,559,688 B2
(45) Date of Patent: May 6, 2003

(54) VOLTAGE COMPARING CIRCUIT

(75) Inventor: Toshio Ohkido, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/166,316

(22) Filed: Jun. 10, 2002

(65) Prior Publication Data

US 2002/0196054 A1 Dec. 26, 2002

(30) Foreign Application Priority Data

Jun. 14, 2001 (JP) ........................................ 2001/180286

(51) Int. Cl.[7] .............................. H03K 5/22; H03K 5/53
(52) U.S. Cl. ........................................... 327/69; 327/77
(58) Field of Search ................................ 327/54–57, 64, 327/65, 67, 69, 74–77, 82, 87–90, 91, 93–96, 337

(56) References Cited

U.S. PATENT DOCUMENTS

| 5,262,686 | A | * | 11/1993 | Kurosawa | 327/77 |
| 5,546,028 | A | | 8/1996 | Yamaguchi | 327/64 |
| 5,565,800 | A | * | 10/1996 | Kobayashi | 327/65 |
| 5,684,485 | A | | 11/1997 | Paillardet et al. | 341/159 |
| 5,936,434 | A | * | 8/1999 | Kumamoto et al. | 327/77 |
| 5,986,599 | A | * | 11/1999 | Matsuo | 341/158 |
| 6,064,239 | A | * | 5/2000 | Matsuoka | 327/63 |
| 6,150,850 | A | * | 11/2000 | Kinoshita | 327/77 |

FOREIGN PATENT DOCUMENTS

| EP | 0 831 592 A1 | 3/1998 |
| EP | 0 939 489 A2 | 9/1999 |
| JP | 3105862 | 9/2000 |

* cited by examiner

*Primary Examiner*—My-Trang Nu Ton
(74) *Attorney, Agent, or Firm*—Scully, Scott, Murphy and Presser

(57) ABSTRACT

A voltage comparing circuit of the invention includes a first and a second capacitor terminals on one side of which are respectively connected to a positive side voltage of an analog input signal and a negative side voltage of a reference voltage via a first and a second switch and terminals on other side of which are commonly connected, a third and a fourth capacitor terminals on one side of which are respectively connected to a positive side voltage of the reference voltage and a negative side voltage of the analog input signal via a third and a fourth switch and terminals on other side of which are commonly connected, a first and a second inverter respectively connected to a common connection terminal of the first and the second capacitors and a common connection terminal of the third and the fourth capacitors and connected with a fifth and a sixth switch respectively between input and output terminals thereof, a seventh and an eighth switch respectively connected between the input terminal of the first inverter and the output terminal of the second inverter and between the input terminal of the second inverter and the output terminal of the first inverter, and a ninth and a tenth switch respectively connected between the first capacitor and the fourth capacitor and between the second capacitor and the third capacitor.

5 Claims, 10 Drawing Sheets

INPUT SAMPLING MODE

AMPLIFYING MODE

LATCH MODE

INPUT SAMPLING MODE

AMPLIFYING MODE

LATCH MODE

INPUT SAMPLING MODE

AMPLIFYING MODE

LATCH MODE

VOLTAGE COMPARING CIRCUIT

BACKGROUND OF THE INVENTION

1. Field of the Invention

The present invention relates to a voltage comparing circuit, particularly to a voltage comparing circuit of a chopper type used in a high-speed A/D converter or the like.

2. Description of the Prior Art

Conventionally, the inventors of the application have proposed a voltage comparing circuit of a chopper type using an inverter in Japanese Patent No. 3105862. An explanation will be given of the voltage comparing circuit of the publication in reference to FIG. 7 through FIG. 10 as follows. FIG. 7 shows the voltage comparing circuit of the publication and FIGS. 8A through 8C respectively show operational states in an input sampling mode, an amplifying mode and a latch mode of the voltage comparing circuit of FIG. 7. Further, FIG. 9 is a time chart showing operation of respective switches in the respective modes. In the drawings, numerals 101 through 108 designate switches, numerals 110, 111, 114 and 115 designate capacitors and numerals 112 and 113 designate inverters. Further, notation Vip designates positive side voltage of an analog input signal, notation Vin designates negative side voltage of the analog input signal, notation Vrp designates positive side voltage of reference voltage and notation Vrn designates negative side voltage of the reference voltage.

First, in the case of input sampling mode, as shown by FIG. 8A and FIG. 9, the switches 101, 102, 105, 106, 107 and 108 are made ON and the switches 103 and 104 are made OFF. Thereby, a difference between the positive side voltage Vip of the analog input signal and logical threshold voltage VLT112 of the inverter 112, is stored in the capacitor 110 and a difference between the negative side voltage Vin of the analog input signal and logical threshold voltage VLT113 of the inverter 113, is stored in the capacitor 111.

In the amplifying mode, as shown by FIG. 8B and FIG. 9, the switches 103 and 104 are made ON and the switches 101, 102, 105, 106, 107 and 108 are made OFF. Thereby, the inverter 112 amplifies a difference between the positive side voltage Vip of the analog input signal and the positive side voltage Vrp of the reference voltage and the inverter 113 amplifies a difference between the negative side voltage Vin of the analog input signal and the negative side voltage Vrn of the reference voltage to thereby respectively generate outputs Vo1 and Vo2.

Next, when the latch mode is brought about, as shown by FIG. 8C and FIG. 9, the switches 103, 104, 107 and 108 are made ON and the switches 101, 102, 105 and 106 are made OFF. Thereby, the inverters 112 and 113 operate as flip-flop since positive feedback is applied thereon via the capacitors 114 and 115. At this occasion, there is enlarged unbalance of output amplitudes of the inverters 112 and 113 produced by the difference between the positive side voltage Vip of the analog input signal and the positive side voltage Vrp of the reference voltage and the difference between the negative side voltage Vin of the analog input signal and the negative side voltage Vrn of the reference voltage, finally, in a transfer characteristic of input voltage Vin and output voltage Vout of the inverter shown in FIG. 10, the output voltage of one of the inverters is changed up to point A near to power source voltage VDD, the output voltage of other of the inverters is changed up to point C near to ground voltage VE and large or small between the analog input signal and the reference voltage is determined.

In this case, when electrostatic capacitance of the capacitor 110 is designated by notation C110, electric charge stored to the capacitor 110 is designated by notation QC110, electrostatic capacitance of the capacitor 111 is designated by notation C111 and electric charge stored to the capacitor 111 is designated by notation QC111, electric charged stored to the respective capacitors in the sampling mode is as shown below.

$$QC110 = C110(Vip - VLT112) \tag{1}$$

$$QC111 = C111(Vin - VLT113) \tag{2}$$

where notations VLT112 and VLT113 respectively designate logical threshold voltages of the inverters 112 and 113.

Further, when voltage at an input terminal of the inverter 112 is designated by notation Vg112 and voltage at an input terminal of the inverter 113 is designated by notation Vg113, since the electric charge stored to the capacitor in the sampling mode is preserved also in the amplifying mode, the voltages at the input terminals of the respective inverters in the amplifying mode are as shown below.

$$\begin{aligned} Vg112 &= Vrp - (Vip - VLT112) \\ &= (Vrp - Vip) + VLT112 \end{aligned} \tag{3}$$

$$\begin{aligned} Vg113 &= Vrn - (Vin - VLT113) \\ &= (Vrn - Vin) + VLT113 \end{aligned} \tag{4}$$

Further, when the positive side voltage Vip and the negative side voltage Vin of the analog input signal are represented by positive and negative analog input signals Vi with common mode voltage Vic of the analog input signal as a reference and the positive side voltage Vrp and the negative side voltage Vrn of the reference voltage are represented by positive and negative reference voltage Vr with common mode voltage Vrc of the reference voltage as a reference, the following relationships are established.

$$Vip = Vic + Vi \tag{5}$$

$$Vin = Vic - Vi \tag{6}$$

$$Vrp = Vrc + Vr \tag{7}$$

$$Vrn = Vrc - Vr \tag{8}$$

Hence, when Equations (5) through (8) are substituted for Equations (3) and (4), the following relationships are established.

$$\begin{aligned} Vg112 &= (Vrc + Vr) - (Vic + Vi) + VLT112 \\ &= (Vrc - Vic) + (Vr - Vi) + VLT112 \end{aligned} \tag{9}$$

$$\begin{aligned} Vg113 &= (Vrc - Vr) - (Vic - Vi) + VLT113 \\ &= (Vrc - Vic) - (Vr - Vi) + VLT113 \end{aligned} \tag{10}$$

When a difference between Vg112 and Vg113 is calculated, although a difference between the common mode voltage Vic of the analog input signal and the common mode voltage Vrc of the reference voltage is canceled, since in the amplifying mode, electric charge is not redistributed to the capacitor 110 and the capacitor 111, the input terminals of the inverters 112 and 113 are applied with a difference between the analog input signal Vi and the reference voltage Vr with the logical threshold voltages of the respective inverters as references and a difference between the common mode voltage Vic of the analog input signal and the common mode voltage Vrc of the reference voltage.

In this way, according to the conventional balance type voltage comparing circuit, the input terminal of the inverter is applied with even the difference between the common mode voltage of the analog input signal and the common mode voltage of the reference voltage other than the difference between the analog input signal and the reference voltage and therefore, when the difference between the common mode voltage of the analog input signal and the common mode voltage of the reference voltage is increased, the output of the inverter is saturated. Therefore, unbalance cannot be caused between the output voltages of the inverters 112 and 113 and in the latch mode, the large or small between the analog input signal Vi and the reference voltage Vr cannot be determined.

When the inverter used in the voltage comparing circuit is ideal having no restriction on the output amplitude, even when the difference between the common mode voltage of the analog input signal and the common mode voltage of the reference voltage is applied to the input of the inverter, the output is not saturated and therefore, in the latch mode, the difference between the outputs of the inverters can be amplified and large or small between the analog input signal and the reference voltage can normally be determined. However, according to the actual inverter, the output amplitude of the inverter is limited and therefore, when the difference between the common mode voltage of the analog input signal and the common mode voltage of the reference voltage is increased, the output of the inverter is saturated and the difference between the outputs of the inverters is nullified and therefore, there poses a problem that in the latch mode, large or small between the analog input signal and the reference voltage cannot normally be determined.

BRIEF SUMMARY OF THE INVENTION

Object of the Invention

It is an object of the invention to provide a voltage comparing circuit capable of normally determining large or small between an analog input signal and reference voltage by canceling common mode voltages of the analog input signal and the reference voltage.

Summary of the Invention

A voltage comparing circuit of the invention includes a first and a second capacitor terminals on one side of which are respectively connected to a positive side voltage of an analog input signal and a negative side voltage of a reference voltage via a first and a second switch and terminals on other side of which are commonly connected, a third and a fourth capacitor terminals on one side of which are respectively connected to a positive side voltage of the reference voltage via a third and a fourth switch and a negative side voltage of the analog input signal and terminals on other side of which are commonly connected, a first and a second inverter respectively connected to a common connection terminal of the first and the second capacitors and a common connection terminal of the third and the fourth capacitors and connected with a fifth and a sixth switch respectively between input and output terminals thereof, a seventh and an eighth switch respectively connected between the input terminal of the first inverter and the output terminal of the second inverter and between the input terminal of the second inverter and the output terminal of the first inverter, and a ninth and a tenth switch respectively connected between the first capacitor and the fourth capacitor and between the second capacitor and the third capacitor.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
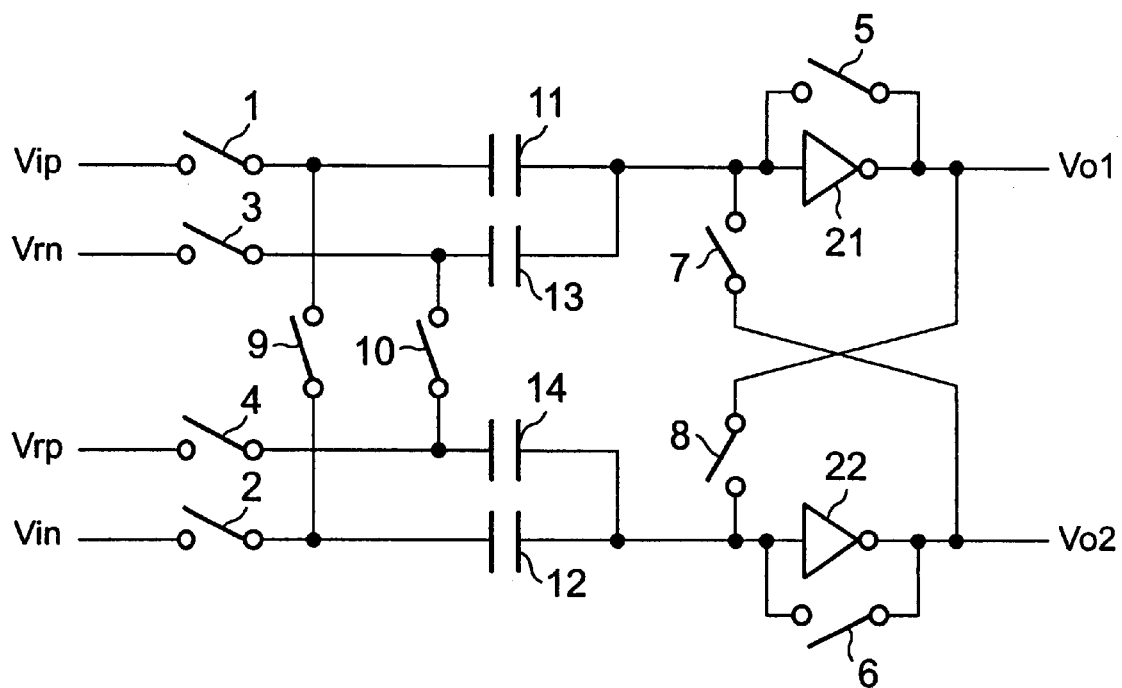
FIG. 1 is a circuit diagram showing a first embodiment of a voltage comparing circuit according to the invention.

Next, an explanation will be given of the invention in reference to FIGS. 1 through 3 as follows.

In the drawings, numerals 1 through 10 designate switches made ON and OFF respectively in accordance with operational modes, numerals 11 through 14 respectively designate capacitors and numerals 21 and 22 designate a pair of inverters. Further, notation Vip designates a positive side voltage of an analog input signal, notations Vin designates a negative side voltage of the analog input signal, notation Vrn designates negative side voltage of reference voltage and notation Vrp designates positive side voltage of the reference voltage.

The switch 1 is connected between the positive side voltage Vip of the analog input signal and the capacitor 11, the switch 2 is connected between the negative side voltage Vin of the analog input signal and the capacitor 12, the switch 3 is connected between the negative side voltage Vrn of the reference voltage and the capacitor 13 and the switch 4 is connected between the positive side voltage Vrp of the reference voltage and the capacitor 14. Terminals of the capacitor 11 and the capacitor 13 and the capacitor and the capacitor 12 on sides opposed to the switches are commonly connected respectively.

The switch 5 is connected between input and output terminals of the inverter 21, the switch 6 is connected between input and output terminals of the inverter 22, the switch 7 is connected between the input terminal of the inverter 21 and the output terminal of the inverter 22 and the switch 8 is connected between the output terminal of the inverter 21 and the input terminal of the inverter 22. Further, the switch 9 is connected between a connection point of the switch 1 and the capacitor 11 and a connection point of the switch 2 and the capacitor 12 and the switch 10 is connected between the connection point of the switch 3 and the capacitor 13 and a connection point of the switch 4 and the capacitor 14.

Next, a detailed explanation will be given of specific operation of the embodiment in reference to FIG. 1 through FIG. 3. As shown by FIGS. 2A, 2B and 2C, operation of a voltage comparing circuit of FIG. 1 is classified into an input sampling mode, an amplifying mode and a latch mode. An explanation will be given of the operation for the respective modes as follows.

Figure 2A:
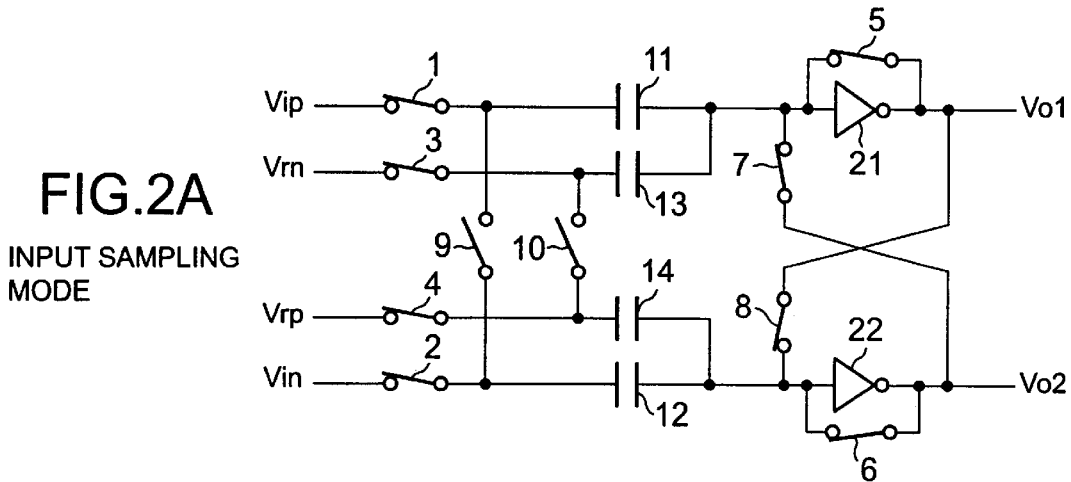
FIGS. 2A through 2C are diagrams respectively showing operational states of respective switches in an input sampling mode, an amplifying mode and a latch mode of the embodiment of FIG. 1.
Figure 3:
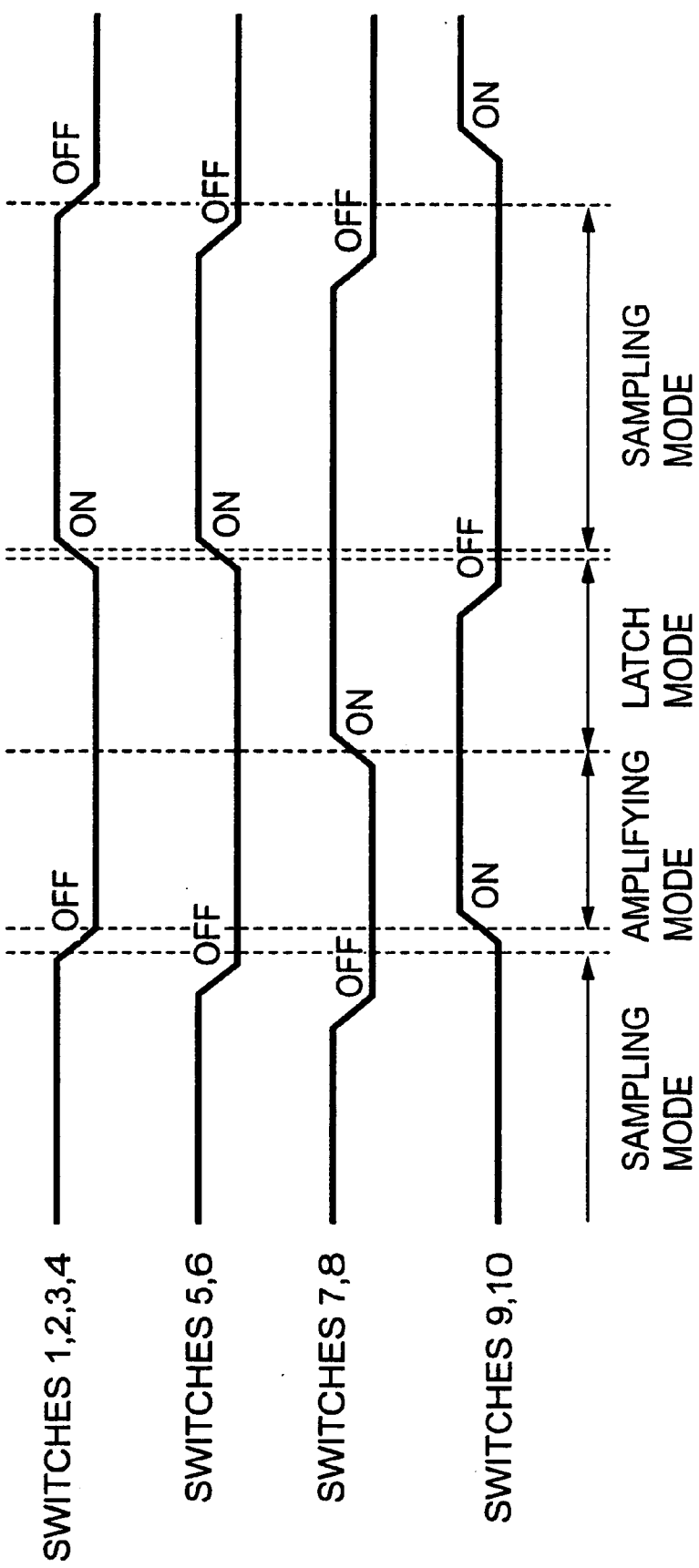
FIG. 3 is a time chart showing the operational states of the respective switches in the respective operational modes of the embodiment of FIG. 1.

First, in the case of the input sampling mode, as shown by FIG. 2A AND FIG. 3, the switches 1, 2, 3, 4, 5, 6, 7 and 8 are made ON and the switches 9 and 10 are made OFF. Thereby, a difference between the positive side voltage Vip of the analog input signal and logical threshold voltage VLT1 of the inverter 21 is stored to the capacitor 11 and a difference between the negative side voltage Vrn of the reference voltage and the logical threshold voltage VLT1 of the inverter 21 is stored to the capacitor 13. Further, a difference between the negative side voltage Vin of the analog input signal and logical threshold voltage VLP2 of the inverter 22 is stored to the capacitor 12 and a difference between the positive side voltage Vrp of the reference voltage and the logical threshold voltage of VLP2 of the inverter 22 is stored to the capacitor 14.

Figure 10:
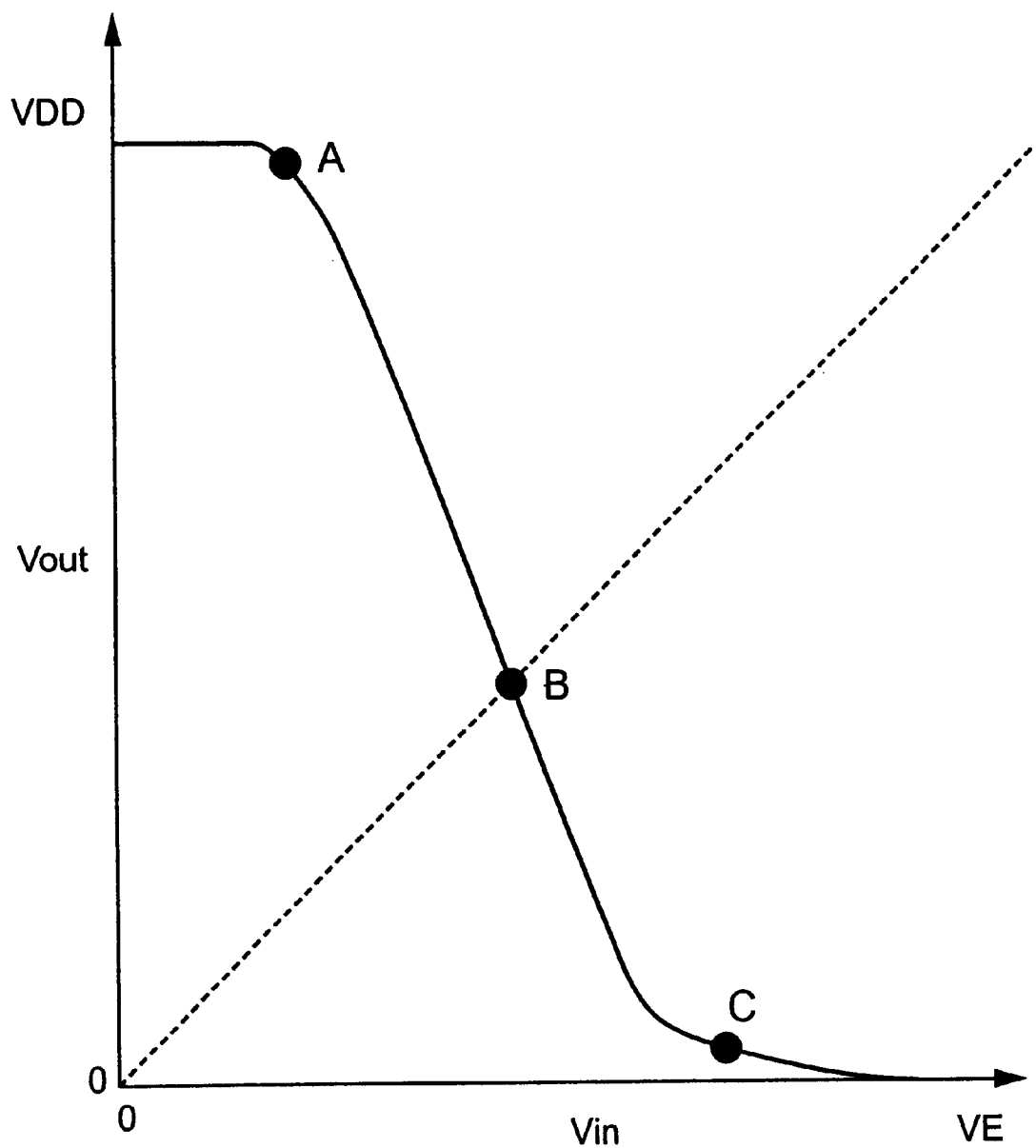
FIG. 10 is a diagram showing a transfer characteristic of an inverter.

Here, in the transfer characteristic shown in FIG. 10, the logical threshold voltage indicates voltage at point B at which the input voltage Vin and the output voltage Vout are equal to each other and is voltage having an inherent value in the respective inverter and is specifically, outputted when the input and the output of the inverter are shortcircuited.

Figure 2B:
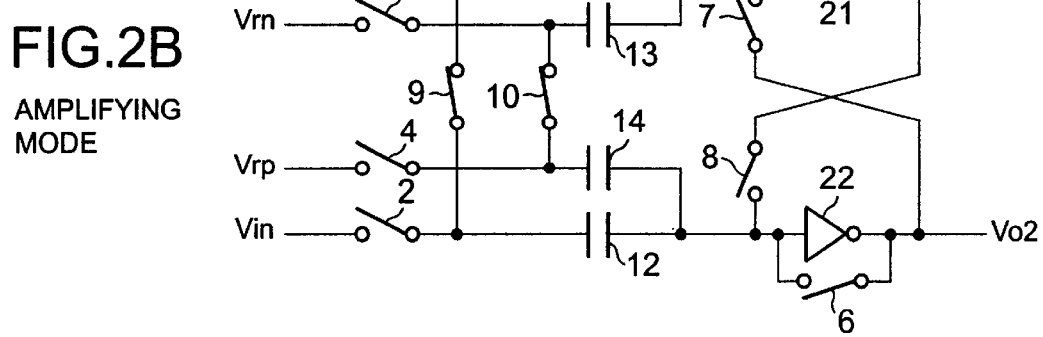

Next, when the amplifying mode is brought about, as shown by FIG. 2B and FIG. 3, the switches 9 and 10 are made ON and the switched 1, 2, 3, 4, 5, 6, 7 and 8 are made OFF. Thereby, the capacitor 11 and the capacitor 12 are connected in series and the series circuit is connected in parallel with the capacitors 13 and 14 similarly connected in series. Thereby, stored electric charge of the capacitors 11, 12, 13 and 14 is redistributed and a difference between an analog input signal removed of common mode voltage and reference voltage removed of common mode voltage, emerges between the input and the output terminals of the inverters 21 and 22. At this occasion, the inverter 21 amplifies a potential variation of the input terminal from the logical threshold voltage VLT1, the inverter 22 amplifies a potential variation of the input terminal from the logical threshold voltage VLT2 and outputs Vo1 and Vo2 are respectively generated thereby.

Figure 2C:
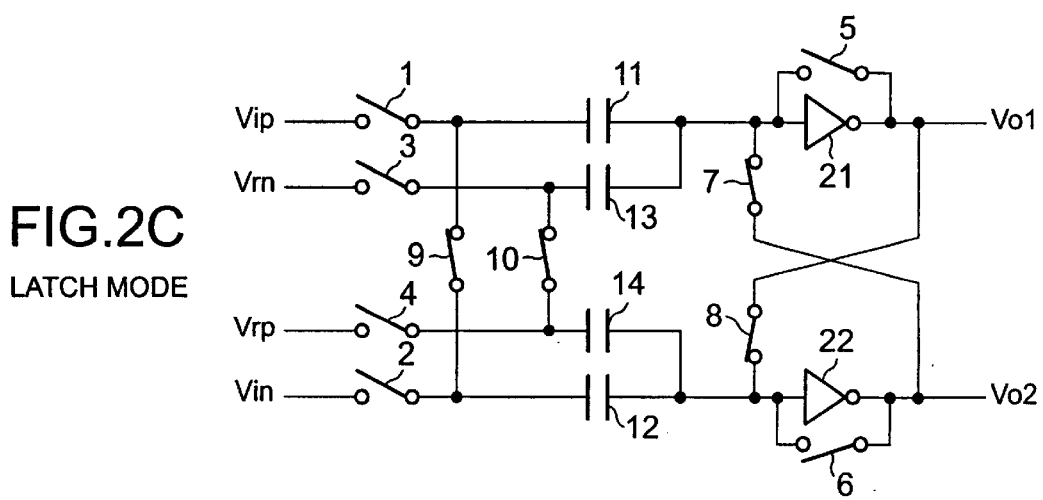

Next, when the latch mode is brought about, as shown by FIG. 2C and FIG. 3, the switches 7, 8, 9 and 10 are made ON and the switches 1, 2, 3, 4, 5 and 6 are made OFF. Thereby, the inverters 21 and 22 are operated as flip-flop since the inverters 21 and 22 are applied with positive feedback. At this occasion, there is enlarged unbalance of output amplitudes of the inverters 21 and 22 produced by a difference between differential voltage of the positive side voltage Vip and the negative side voltage Vin of the analog input signal and differential voltage of the positive side voltage Vrp and the negative side voltage Vrn of the reference voltage, finally, in the transfer characteristic between the input voltage Vin and the output voltage Vout of the inverter shown in FIG. 10, output voltage of one of the inverters is changed up to point A near to power source voltage VDD and output voltage of other of the inverters is changed up to point C near to ground voltage VE to thereby determine large or small between the analog input signal and the reference voltage. Thereafter, the input sampling mode, the amplifying mode and the latch mode are repeatedly carried out and at the respective time, large or small between the analog input signal and the reference voltage is determined.

An explanation will be given here of principle of not effecting influence on the determination of large or small between the analog input signal and the reference voltage by removing the respective common mode voltages of the analog input signal and the reference voltage according to the embodiment in reference to equations.

First, when electrostatic capacitance of the capacitor 11 is designated by notation C11, electric charge stored to the capacitor 11 is designated by notation QC11, electrostatic capacitance of the capacitor 12 is designated by notation C12, electric charge stored to the capacitor 12 is designated by notation QC12, electrostatic capacitance of the capacitor 13 is designated by notation C13, electric charge stored to the capacitor 13 is designated by notation QC13, electrostatic capacitance of the capacitor 14 is designated by notation C14 and electric charge stored to the capacitor 14 is designated by notation Q14, electric charge stored to the respective capacitors in the sampling mode is as follows.

$$QC11 = C11(Vip - VLT1) \tag{11}$$

$$QC12 = C12(Vin - VLT2) \tag{12}$$

$$QC13 = C13(Vrn - VLT1) \tag{13}$$

$$QC14 = C14(Vrp - VLT2) \tag{14}$$

When a voltage difference between an input terminal of the inverter 21 and an input terminal of the inverter 22 is designated by notation Vd, since electric charge stored to the capacitor in the sampling mode is preserved also in the amplifying mode, when electric charge stored to the capacitors 11, 12, 13 and 14 is redistributed, the voltage difference Vd in the amplifying mode is as shown below.

$$Vd = \frac{(QC11 - QC12) + (QC13 - QC14)}{\frac{C11 \times C12}{C11 + C12} + \frac{C13 \times C14}{C13 + C14}} \tag{15}$$

where, when with regard to the sampling capacitances C11, C12, C13 and C14, capacitances thereof are set as C11=C12=C13=C14=CS and Equation (15) is substituted for Equations (1), (2), (3) and (4), the following relationship is established.

$$\begin{aligned} Vd &= \frac{\{CS(Vip - VLT1) - CS(Vin - VLT2)\} +}{CS} \\ &\quad \frac{\{CS(Vrn - VLT1) - CS(Vrp - VLT2)\}}{CS} \\ &= \frac{CS(Vip - VLT1 - Vin + VLT2 + Vrn - VLT1 - Vrp + VLT2)}{CS} \\ &= (Vip - Vin) - (Vrp - Vrn) - 2VLT1 + 2VLT2 \end{aligned} \tag{16}$$

When the logical threshold voltage VLT1 of the inverter 21 and the logical threshold voltage VLT2 of the inverter 22 are made to be equal to each other, Equation (16) becomes as follows.

$$Vd = (Vip - Vin) - (Vrp - Vrn) \tag{17}$$

Further, when the positive side voltage Vip and the negative side voltage Vin of the analog input signal are represented by positive and negative analog input signals Vi with common mode voltage Vic of the analog input signal as a reference and the positive side voltage Vrp and the negative side voltage Vrn of the reference voltage are represented by positive and negative reference voltages Vr with common voltage Vrc of the reference voltage as a reference, as has been explained previously, the following relationships are established.

$$Vip = Vic + Vi \quad (5)$$

$$Vin = Vic - Vi \quad (6)$$

$$Vrp = Vrc + Vr \quad (7)$$

$$Vrn = Vrc - Vr \quad (8)$$

Therefore, when Equations (5), (6), (7) and (8) are substituted for Equation (17), the following relationship is established.

$$Vd = \{(Vic + Vi) - (Vic - Vi)\} - \{(Vrc + Vr) - (Vrc - Vr)\} \quad (18)$$

$$= 2(Vi - Vr)$$

Therefore, as is apparent from Equation (18) the common mode voltage Vic of the analog input signal and the common mode voltage Vrc of the reference voltage can be canceled and only the difference between the analog input signal and the reference voltage emerges between the input terminals of the inverters 21 and 22. Even when there is present the difference between the common mode voltage of the analog input signal and the common mode signal of the reference voltage, what is amplified in the amplifying mode is only the difference between the analog input signal and the reference voltage and therefore, large or small between the analog input signal Vi and the reference voltage Vr can be determined without being effected with influence of the common mode voltage of the analog input signal and the common mode voltage of the reference voltage in the latch mode.

Further, since the analog input signal and the reference voltage are sampled at the same time, even when the logical threshold voltage of the inverter is varied by a variation in power source voltage or the like, influences thereby on the analog input signal and the reference voltage are made to be equal to each other and therefore, there is also achieved an effect of capable of alleviating influence of the variation in the logical threshold voltage effected on determination of large or small between the analog input signal and the reference voltage.

Figure 4:
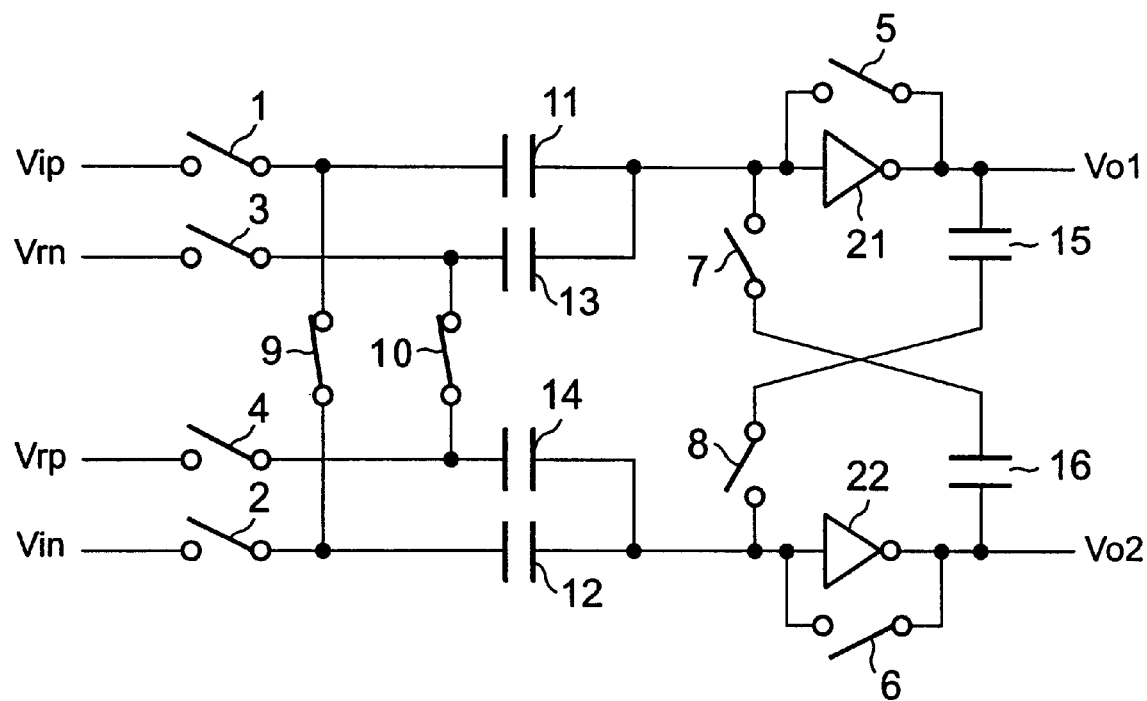
FIG. 4 is a circuit diagram showing a second embodiment of the invention.

Next, an explanation will be given of a second embodiment of the invention in reference to FIG. 4 through FIG. 6.

In the drawings, numerals 1 through 10 designate switches, numerals 11 through 16 designate capacitors and numerals 21 and 22 designate inverters.

According to the embodiment, what is different from the embodiment shown in FIG. 1 is that a capacitor 15 is connected between an output of the inverter 21 and the switch 8, a capacitor 16 is connected between an output of the inverter 22 and the switch 7 and a positive feedback loop formed by the switches 7 and 8 is inserted with the capacitors 15 and 16. The other constitution is similar to that of FIG. 1.

Next, a detailed explanation will be given of operation of the embodiment in reference to FIG. 4 through FIG. 6. According to the embodiment, there is carried out operation similar to that of the voltage comparing circuit of the first embodiment and since the capacitors 15 and 16 are inserted to the positive feedback loop formed by the switch 7 and 8, when large or small between the analog input signal and the reference voltage is determined in the latch mode, according to output terminals of the inverters 21 and 22, in the transfer characteristic between the input voltage Vin and the output voltage Vout of the inverter shown in FIG. 10, output voltage of one of the inverters is changed up to point A near to power source voltage VDD and output voltage of other of the inverters is changed up to point C near to ground voltage VE.

In this case, an input terminal of the inverter 21 is connected to the output terminal of the inverter 22 and an input terminal of the inverter 22 is connected to the output terminal of the inverter 21 respectively via the switches and the capacitors and therefore, voltage of the input terminal of the inverter 21 stays to be voltage produced by dividing voltage of the output terminal of the inverter 22 by capacitance of the capacitor 16 and input capacitance of the input terminal of the inverter 21 and voltage at the input terminal of the inverter 22 stays to be voltage produced by dividing voltage at the output terminal of the inverter 21 by capacitance of the capacitor 15 and input capacitance of the input terminal of the inverter 22.

Operation of a voltage comparing circuit according to the embodiment can be classified into an input sampling mode, an amplifying mode and a latch mode respectively shown by FIG. 5. An explanation will be given of the respective operational modes as follows.

Figure 5A:
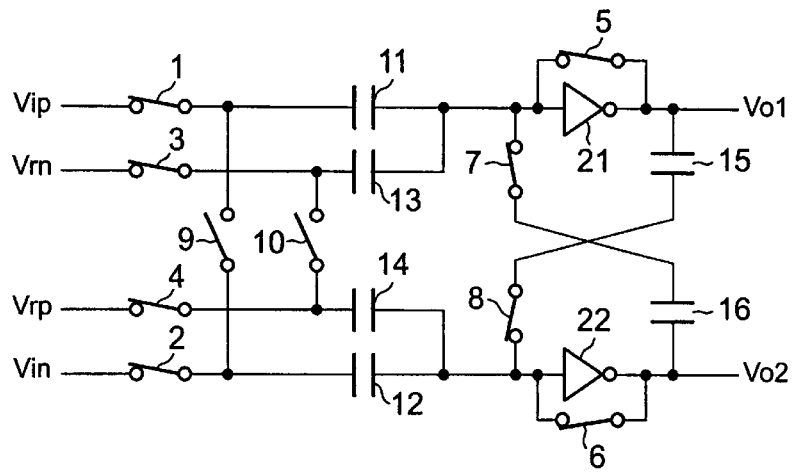
FIGS. 5A through 5C are diagrams respectively showing operational states of respective switches in an input sampling mode, an amplifying mode and a latch mode of the embodiment of FIG. 4.
Figure 6:
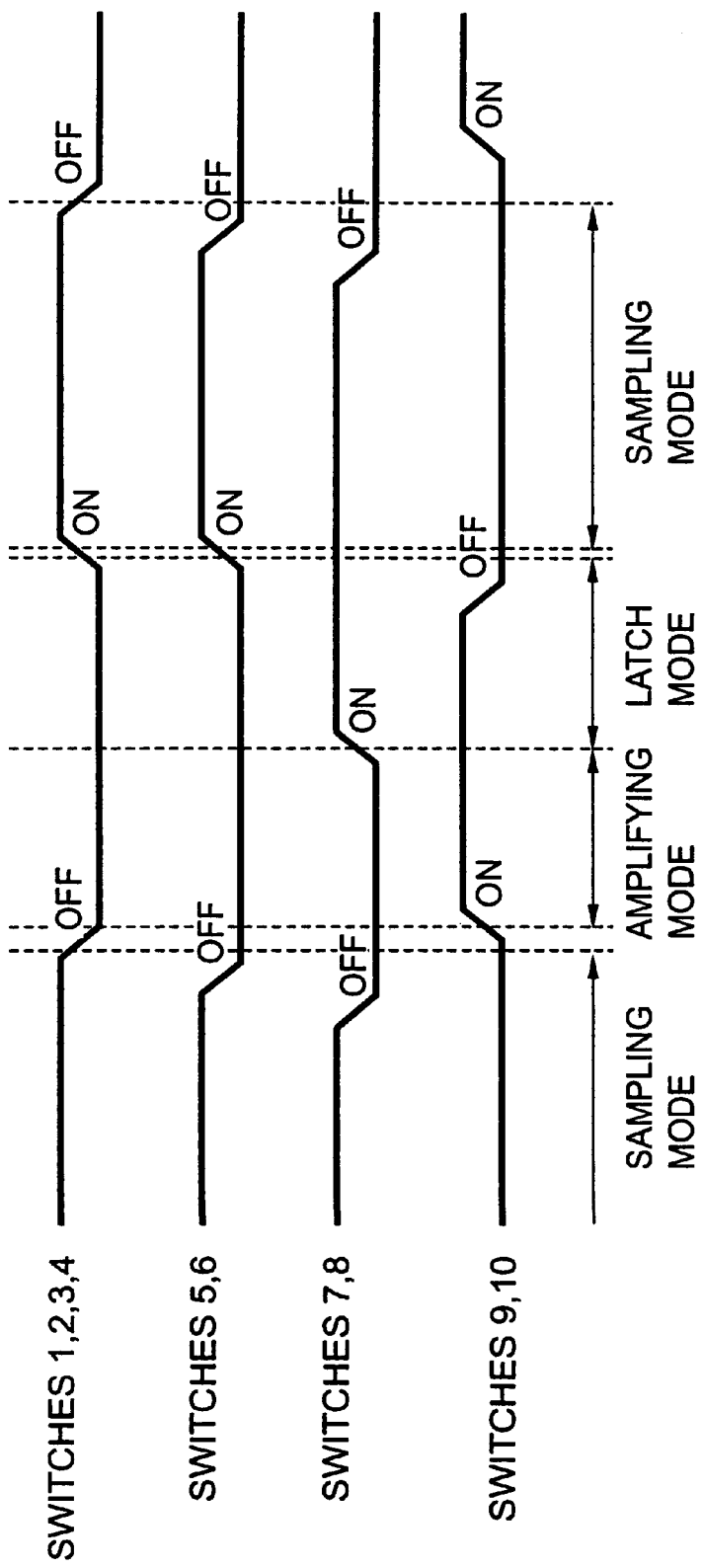
FIG. 6 is a time chart showing the operational states of the respective switches in the respective operational modes of the embodiment of FIG. 4.
Figure 7:
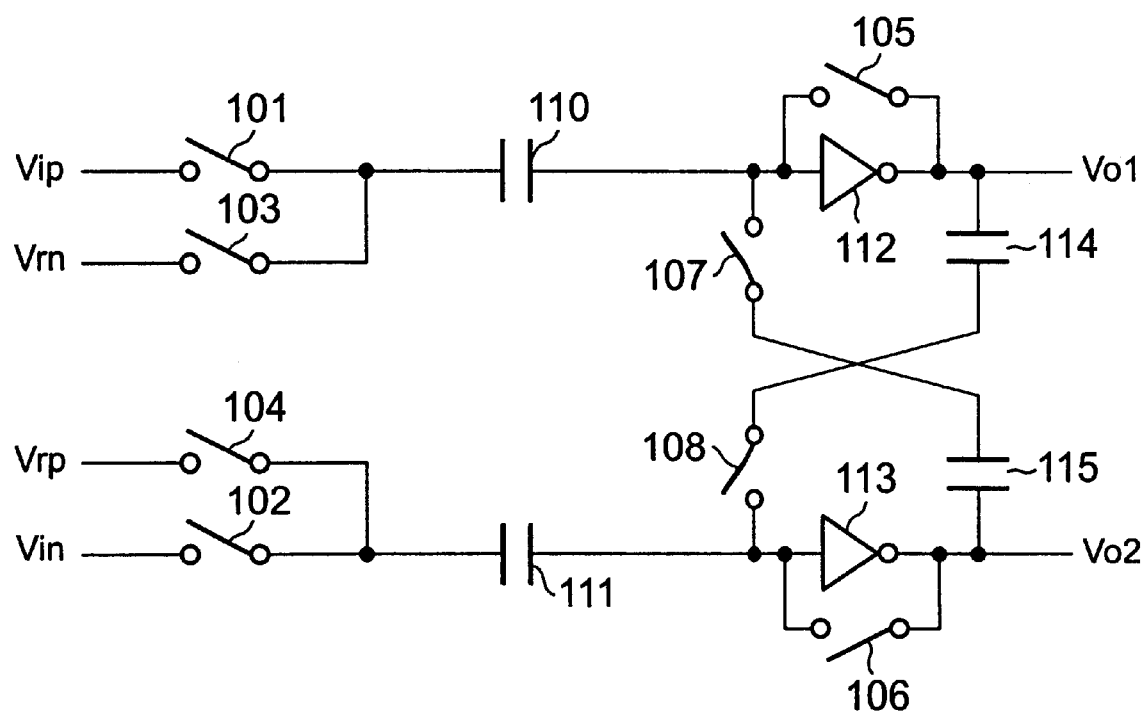
FIG. 7 is a circuit diagram showing a voltage comparing circuit of a conventional example.
Figure 8A:
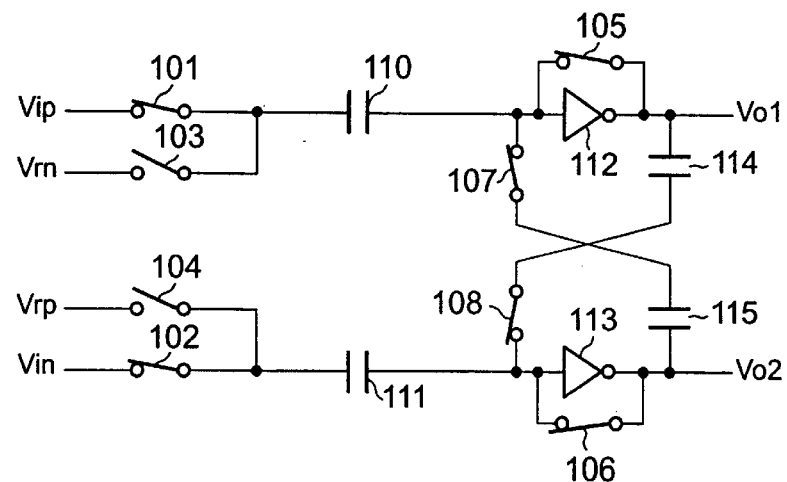
FIGS. 8A through 8C are diagrams respectively showing operational states of respective switches in an input sampling mode, an amplifying mode and a latch mode of the voltage comparing circuit of FIG. 7.
Figure 8B:
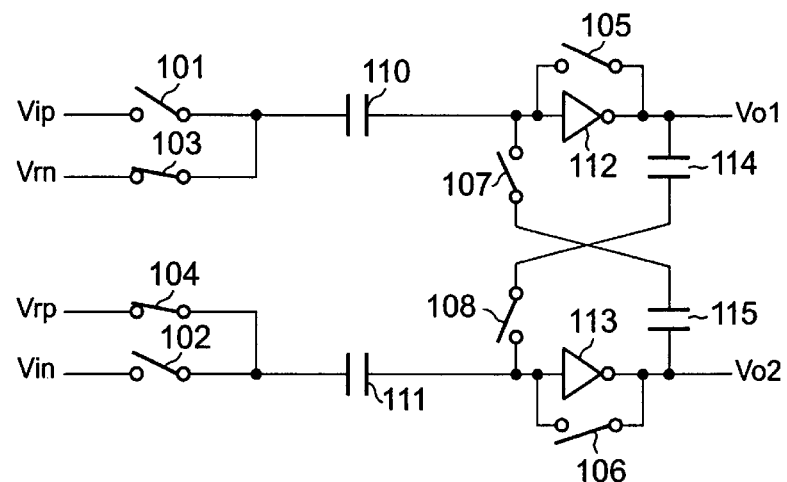
Figure 8C:
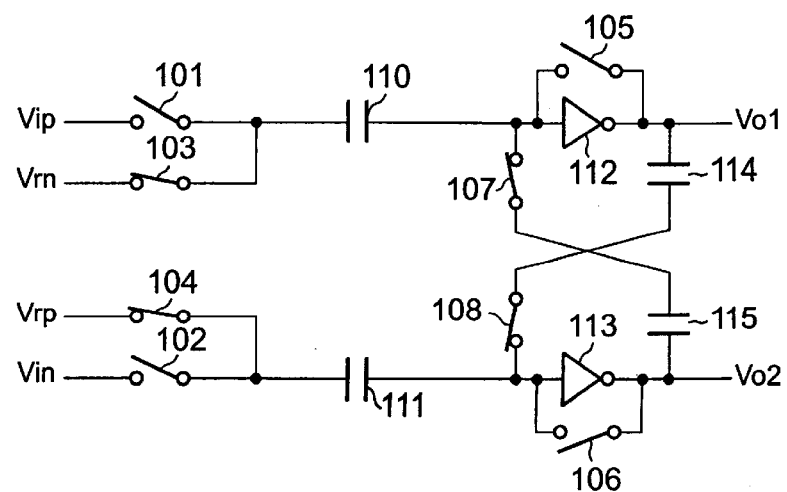
Figure 9:
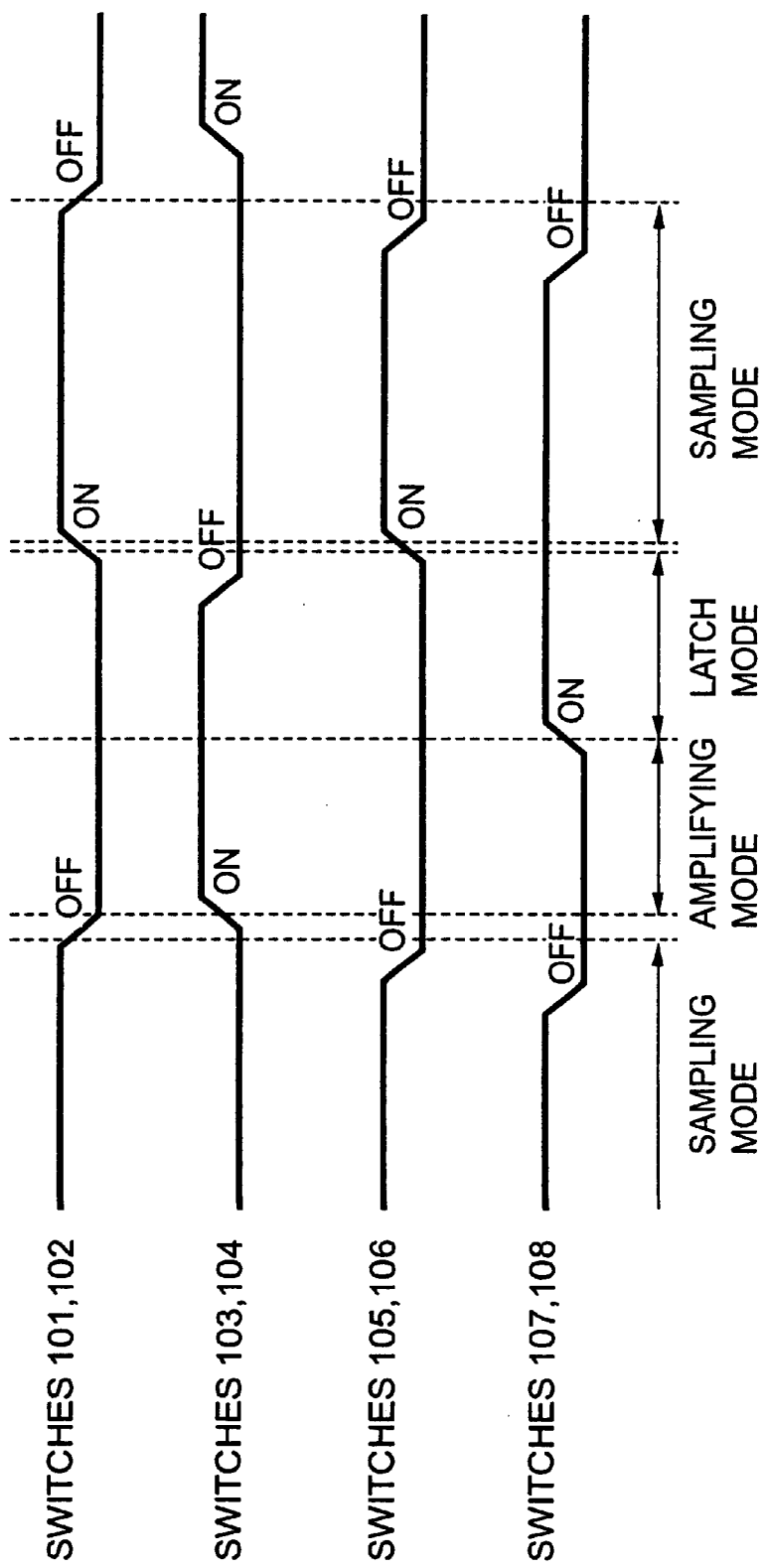
FIG. 9 is a time chart showing the operational states of the respective switches in the respective operational modes of the voltage comparing circuit of FIG. 7.

First, in the input sampling mode, as shown by FIG. 5A and FIG. 6, the switches 1, 2, 3, 4, 5, 6, 7 and 8 are made ON and the switches 9 and 10 are made OFF. Thereby, the difference between the positive side voltage Vip of the analog input signal and the logical threshold voltage VLT1 of the inverter 21 is stored to the capacitor 11 and the difference between the negative side voltage Vrn of the reference voltage and the logical threshold voltage VLT1 of the inverter 21 is stored to the capacitor 13. Further, the difference between the negative side voltage Vin of the analog input signal and the logical threshold voltage VLT2 of the inverter 22 is stored to the capacitor 12, the difference between the positive side voltage Vrp of the reference voltage and the logical threshold voltage VLT2 of the inverter 22 is stored to the capacitor 14 and a difference between the logical threshold voltages VLT1 and VLT2 is stored to the capacitors 15 and 16.

Figure 5B:
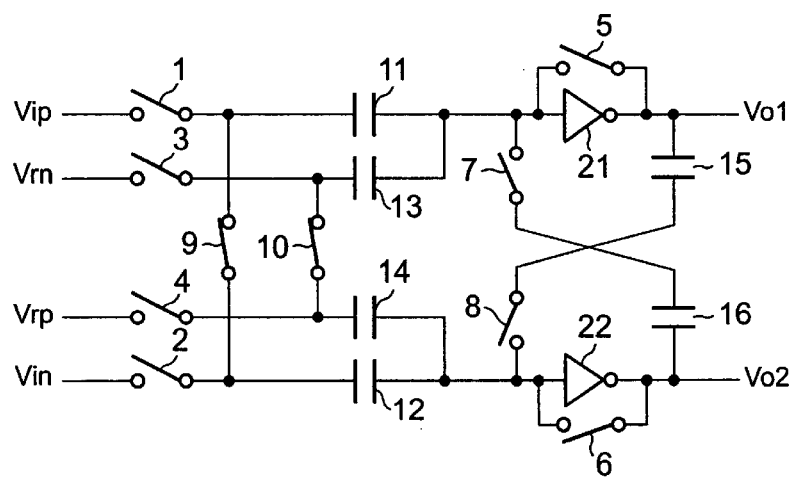

Next, when the amplifying mode is brought about, as shown by FIG. 5B and FIG. 6, the switches 9 and 10 are made ON and the switch 1, 2, 3, 4, 5, 6, 7 and 8 are made OFF. Thereby, the capacitor 11 and the capacitor 12 are connected in series and the series circuit is connected in parallel with the capacitors 13 and 14 similarly connected in series. Thereby, stored electric charge of the capacitors 11, 12, 13 and 14 is redistributed and a difference between an analog input signal removed of common mode voltage and reference voltage removed of common mode voltage, emerges between the input terminals of the inverters 21 and 22. At this occasion, the inverter 21 amplifies the potential variation from the logical threshold voltage VLT1 of the input terminal, the inverter 22 amplifies the potential variation from the logical threshold voltage VLT2 of the input terminal and outputs Vo1 and Vo2 are generated respectively thereby.

Figure 5C:
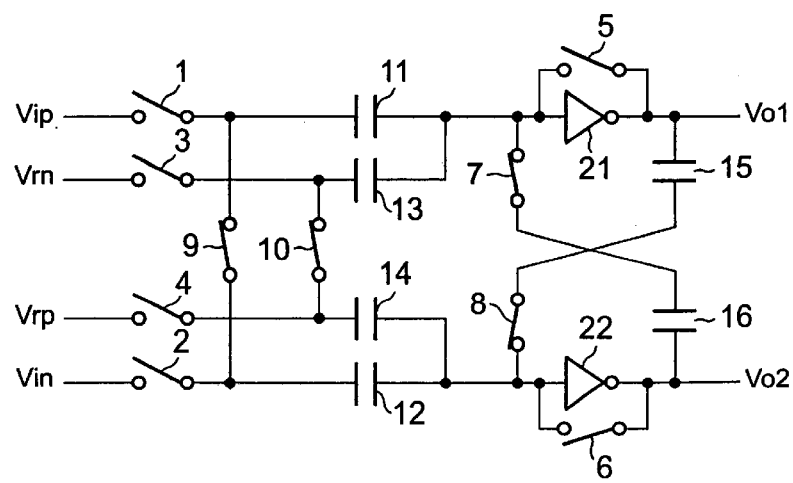

In the latch mode, as shown by FIG. 5C and FIG. 6, the switches 7, 8, 9 and 10 are made ON and the switches 1, 2, 3, 4, 5 and 6 are made OFF. Thereby, the inverters 21 and 22 are operated as flip-flop since the inverters 21 and 22 are applied with positive feedback via the capacitors 15 and 16.

At this occasion, there is enlarged unbalance of output amplitudes of the inverters 21 and 22 produced by a difference between differential voltage of the positive side voltage Vip and the negative side voltage Vin of the analog input signal and differential voltage between the positive side voltage Vrp and the negative side voltage Vrn of the reference voltage, finally, in the transfer characteristic between the input voltage Vin and the output voltage Vout of the inverter shown in FIG. 10, output voltage of one of the inverters is changed up to point A near to power source voltage VDD and output voltage of other of the inverters is changed up to point C near to ground voltage VE to thereby determine large or small between the analog input signal and the reference voltage.

According to the embodiment, similar to the first embodiment, large or small between the analog input signal Vi and the reference voltage Vr can be determined without being effected with influence on common mode voltage of the analog input signal and the common mode voltage of the reference voltage. Further, by operation of the capacitors 15 and 16 inserted to the positive feedback loop constituted by the switches 7 and 8, differences between voltages of the input terminals of the inverters 21 and 22 and the respective logical threshold voltages of the inverters 21 and 22 in the latch mode, are reduced and therefore, when the latch mode transits to the sampling mode, a time period of charging or discharging the input terminals of the inverters 21 and 22 to the logical threshold voltages of the respective inverters can be shortened, a time period necessary for sampling can be shortened and therefore, the voltage comparing circuit can be operated at high speed.

Further, constant current circuits maybe inserted between power source inputs and power sources of the inverters 21 and 22 in the first and the second embodiments. Thereby, maximum current flowing in two pieces of the inverters 21 and 22 is made substantially constant regardless of power source voltage and even when the power source voltage is changed, a change in current consumption of the inverter can be reduced.

As has been explained above, according to the invention, by canceling the common mode voltage of the analog input signal and the common mode voltage of the reference voltage, large or small between the analog input signal and the reference voltage can be determined without being effected with influence of the common mode voltages. Further, by inserting the capacitors to the positive feedback loop, the time period necessary for sampling can be shortened and the operation can be carried out at high speed.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A voltage comparing circuit comprising:

a first and a second capacitor terminals on one side of which are respectively connected to a positive side voltage of an analog input signal and a negative side voltage of a reference voltage via a first and a second switch and terminals on other side of which are commonly connected;

a third and a fourth capacitor terminals on one side of which are respectively connected to a positive side voltage of the reference voltage and a negative side voltage of the analog input signal via a third and a fourth switch and terminals on other side of which are commonly connected;

a first and a second inverter respectively connected to a common connection terminal of the first and the second capacitors and a common connection terminal of the third and the fourth capacitors and connected with a fifth and a sixth switch respectively between input and output terminals thereof;

a seventh and an eighth switch respectively connected between the input terminal of the first inverter and the output terminal of the second inverter and between the input terminal of the second inverter and the output terminal of the first inverter; and a ninth and a tenth switch respectively connected between the first capacitor and the fourth capacitor and between the second capacitor and the third capacitor;

wherein said voltage comparing circuit respectively includes a first mode of making all of the switches excluding the ninth and the tenth switches on, a second mode of making the ninth and the tenth switches on and making remaining ones of the switches off and a third mode of making the seventh through the tenth switch on and making the first through the sixth switches off.

2. The voltage comparing circuit according to claim 1:

wherein the seventh and the eighth switches are respectively connected in series with a fifth and a sixth capacitor.

3. The voltage comparing circuit according to claim 1:

wherein the first operational mode, the second operational and the third operational mode are repeatedly carried out and at respective times thereof, a result of comparing the analog input signal and the reference voltage is outputted from outputs of the first and the second inverters.

4. The voltage comparing circuit according to claim 1:

wherein a common mode voltage of the analog input signal and a common mode voltage of the reference voltage are removed by connecting in parallel a series circuit of the first capacitor and the fourth capacitor and a series circuit of the second capacitor and the third capacitor by making the ninth and the tenth switches on in the second operational mode.

5. The voltage comparing circuit according to claim 1:

wherein constant current circuits are inserted between power source inputs and power sources of the first and the second inverters.

* * * * *